United States Patent [19]
Lee

[11] Patent Number: 5,936,970
[45] Date of Patent: Aug. 10, 1999

[54] REPAIR CIRCUIT OF A FLASH MEMORY CELL AND REPAIR METHOD

[75] Inventor: Jong Sang Lee, Ichon, Rep. of Korea

[73] Assignee: Hyundai Electronics Industries, Co., Ltd., Kyungki-do, Rep. of Korea

[21] Appl. No.: 08/721,170

[22] Filed: Sep. 26, 1996

[30] Foreign Application Priority Data

Sep. 27, 1995 [KR] Rep. of Korea .................. 95-32048

[51] Int. Cl.⁶ .................................................. G06F 11/00
[52] U.S. Cl. ........................................ 371/10.2; 371/21.1
[58] Field of Search ................................ 371/10.2, 10.3, 371/21.1; 365/200, 201

[56] References Cited

U.S. PATENT DOCUMENTS 5,457,650 10/1995 Sugiura et al. ........................ 365/184

FOREIGN PATENT DOCUMENTS

2 265 031 9/1993 United Kingdom .

Primary Examiner—Phung M. Chung
Attorney, Agent, or Firm—Scott C. Harris, Esq.

[57] ABSTRACT

The present invention relates to a repair circuit of a flash memory cell and repair method and has excellent effects in that it can reduce the power consumption by detecting the power supply applied to the chip, latching the repaired address stored in the fuse block after the chip itself sequentially reads the fuse block, comparing the latched address with the input repair address to access the main cell and repair cell, consuming the power only while the chip reads the fuse block, and using the latched repair address at other operation, and it can reduce the area of the chip by constructing into a cell array the cells to which the repair address is to be stored and using the sense amplifier commonly.

8 Claims, 10 Drawing Sheets

REPAIR CIRCUIT OF A FLASH MEMORY CELL AND REPAIR METHOD

BACKGROUND OF INVENTION

1. Field of the Invention

The present invention relates to a repair circuit of a flash memory cell and a repair method and, more particularly, to a repair circuit of a flash memory cell and a repair method which can detect the power supply applied to the chip, latch the repaired address stored in the fuse block after the chip itself sequentially reads the fuse block, compare the latched address with the input repair address to access the main cell or redundancy cell.

2. Information Disclosure Statement

In general, a terminology of "repair" refers to rearing in advance extra redundancy cells in addition to main cells and replacing the main cell with the extra redundancy cell prepared in advance is some of the main cells are found to be poor.

In conventional repair technology, each cell in which a repair address is stored has a circuit for sensing the cell so that the cell can not be constructed into an array. Therefore, there is a problem that each cell includes a plurality of dummy cells, and the chip area is increased due to a sense amplifier and a dummy cell. Furthermore, there is a disadvantage in that since the chip always senses all the cells during the operation of the chip, the power consumption becomes large.

SUMMARY OF THE INVENTION

Therefore, an object of the present invention is to provide a repair circuit of a flash memory cell and a repair method which can solve the above described advantages by detecting the power supply applied to the chip, latching the repaired address stored in the fuse block after the chip itself sequentially reads the fuse block, comparing the latched address with the input repair address to access the main cell or redundancy cell, consuming the power only while the chip reads the fuse block, and using the latched repair address at other operation.

The present invention to achieve the above described object is characterized in that it comprises an address generating circuit for generating an address by detecting an input supply voltage; a repair control circuit for generating a program, program check and readout operation performance signal of a redundancy cell according to an output signal of the address generating circuit and a plurality of input signal; a first decoder circuit taking as inputs the address of the address generating circuit, the program check signal of the redundancy cell which is an output signal of the repair control circuit, and a flag address; a fuse block of which a select gate line is selected according to the output signal of the first decoder circuit; a voltage generating circuit, which takes as an input the program signal of the redundancy cell which is an output signal of the repair control circuit, and which selectively supplies a voltage to a control gate of the cell in the fuse block; a sense amplifier circuit, which takes as inputs the program signal, readout signal and repair address of said redundancy cell which are output signals of said repair control circuit, and which senses the cell data in the fuse block; a data latch and address comparison circuit, which takes as inputs the output signal and the repair address of the first decoder circuit, latches the data sensed at said sense amplifier circuit, and checks the matching by comparing the latched data with the input repair address; and a second decoder circuit which selects a repair line according to an address output from the data latch and address comparison circuit and generates a control signal to prevent the pass of a main cell.

The present invention is further characterized in that is comprises the steps of enabling a repair check mode by applying a repair signal and readout signal; applying a flag address to be checked; checking the use of flag cell; storing the used flag cell and the flag cell not used, respectively, according to the use of the flag cell; checking the last flag address, and if it is not the last flag address, applying next flag address and repeating the checking step; and checking the last flag address, and if it is the last flag address, applying a readout signal and terminating the repair check operation.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts in the several views of the drawings.

DETAILED DESCRIPTION OF THE INVENTION

A detailed description of the present invention is given below with reference to the accompanying drawings.

Figure 1:
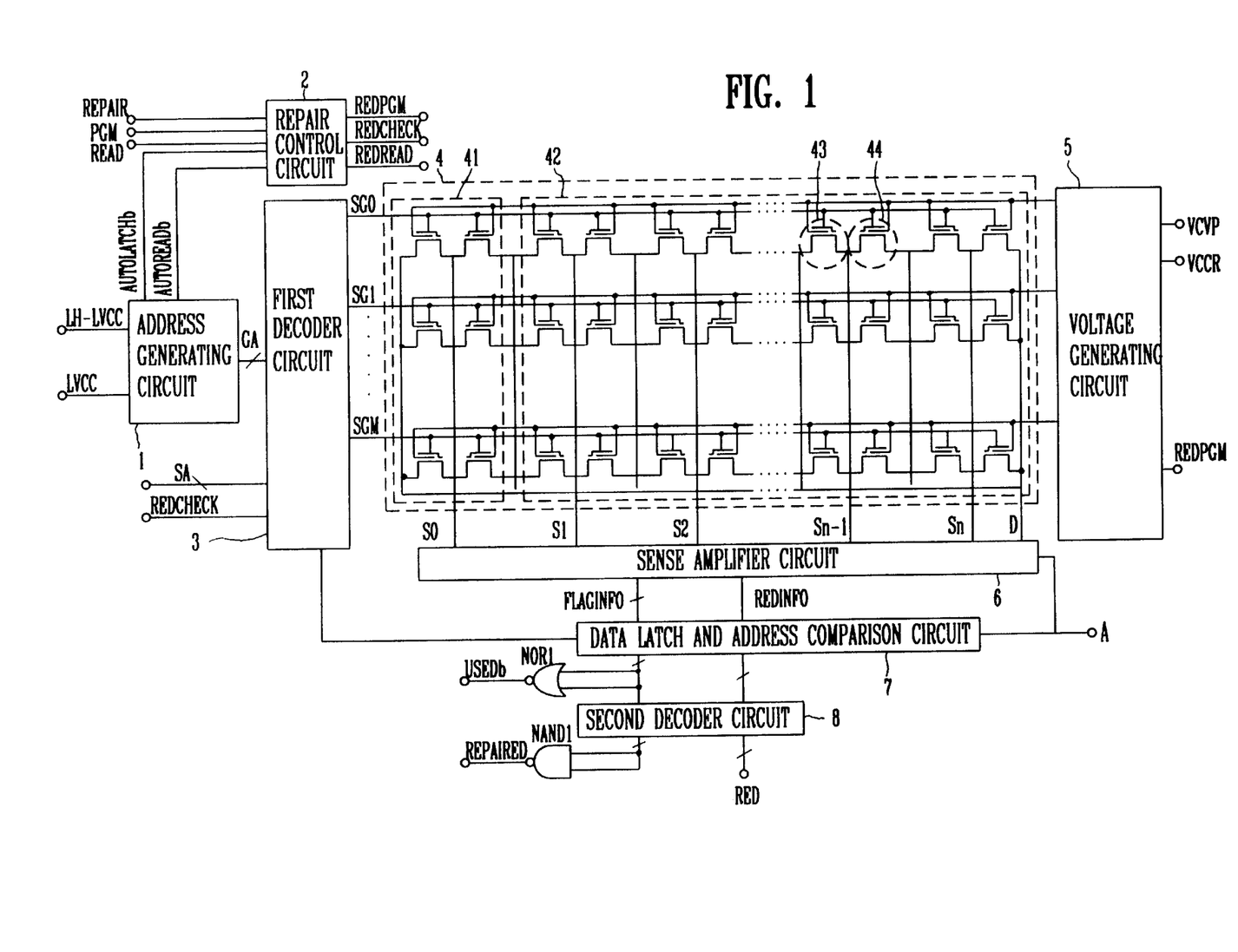
FIG. 1 is a block diagram to illustrate a repair circuit of a flash memory cell according to the present invention.

FIG. 1 is a block diagram to illustrate a repair circuit of a flash memory cell according to the present invention. The address generating circuit 1 detects a supply voltage LH-LVCC and LVCC and outputs an address control signal AUTOLATCHb and AUTOREADb for controlling a repair control circuit 2 and an address GA for controlling a first decoder circuit 3. The address control signal AUTO-LATCHb and AUTOREADb operates up to the last address output from the address generating circuit 1. The repair control circuit 2 outputs a program, program check and read out operation performance signal of a redundancy cell REDPGM, REDCHECK and REDREAD taking as inputs a plurality of input signal REPAIR, PGM and READ and the address control signal AUTOLATCHb and AUTOREADb output from the address generating circuit 1. To a first decoder circuit 3 are input the address GA output from the address generating circuit 1, the program check signal REDCHECK of the redundancy cell output from the repair control circuit 2, and a flag address SA. At this time, the first decoder circuit 3 outputs signals SGO through SGm to select a select gate line of a cell connected in a fuse block 4 and a data latch signal LATCHb to control a data latch and address comparison circuit 7. In the fuse block 4 which takes as an input the output signal SGO through SGm of the first decoder circuit 3, only one among the select gate lines of the cells is selected according to the output signal SGi (i: represents a variable) selected at the first decoder circuit 3. In addition, a voltage generating circuit 5 takes as an input the program signal REDPGM of the redundancy cell output from the repair control circuit 2 and selectively supplies a voltage VCVP and VCCR to control gates of cells connected in the fuse block 4. Thereafter, a sense amplifier circuit 6 take as inputs the program signal REDPGM, readout signal REDREAD of the redundancy cell output from the repair control circuit 2, and an externally input repair address A, senses a cell data in the fuse block 4, and applies a program data to the redundancy cell at the time of programming the redundancy cell. Then, the data latch and address comparison circuit 7 takes a inputs the data latch signal LATCHb output from the first decoder circuit 3 and the externally input repair address A, latches the data sensed at the sense amplifier circuit 6, and checks the consistency by comparing the latched data and the repair address. The a second decoder circuit 8 which takes as inputs signals FLAGUSED and MATCH output from the data latch and address comparison circuit 7 selects a redundancy line RED, and generates through a NAND gate NAND1 a repaired signal REPAIRED which prevents a pass of the main cell. On the other hand, in order for the cells (that is, cells (43, 44) connected to the same select gate lines and adjacent to each other sharing a source electrode) in the fuse block 4 to have same data, all drain electrodes 45 of a cell array are commonly connected. The sense amplifier 6 is connected to the source electrode of the cell. Therefore, since two cells having same information are simultaneously read out at the time of read out operation, a sensing velocity is increased. For example, if an address to be repaired is determined, the flag cells 41 of the fuse block 4 is read first, then it is checked whether the flag cell 41 is used or not. When reading out the flag cell 41 of the fuse block 4, the repair input REPAIR and read out input READ are made high, then an address of the read out operation is supplied to the flag address input SA. Thereafter, by checking the user signal USEDb output through a NOR gate NOR1, the content of the flag cell 41 can be known. If the user signal USEDb is high, it indicates that the flag cell 41 has not been used, and to the contrary, if the user signal USEDb is low, it indicates that the flag cell 41 has been used. On the other hand, by programming the address to be repaired for the flag cell 41, which has not been used, and corresponding address resistor cells 42, the repair can become possible. The program of the address for repair makes the repair signal REPAIR high, applies the flag address SA to the address input of the flag cell 41, applies the repair address to the repair address input A, and applies high to the program input PGM. At this time, the first decoder circuit 3 which takes as an input the flag address SA selects one of the select gate lines SGo to SGm of the fuse block. Furthermore, the repair address A is input to the sense amplifier circuit 6 so as to apply 5 V voltage to the drain electrode D of each cell and decide the voltage of the source electrode. At this time, a signal REDCGHV output from the voltage generating circuit 5 becomes the control gate voltage VCVP to program the cell and is supplied to the control gate of all the cells of the fuse block 4. Therefore, the sense amplifier 6 which decides the voltage of the source electrode of the repair address register cells 42 is operated according to the information of the repair address A. That is, if the repair address A is High, the voltage of the source electrode output from the sense amplifier 6 becomes low (OV), and the voltage of the drain electrode becomes high (5 V). Therefore, the program condition of the cell is satisfied. If the repair address A is low, the voltage of the source electrode output from the sense amplifier 6 becomes high (5 V), and both of the voltages of source electrode and drain electrode of the cell become high (5 V). Therefore, the program condition of cell is not satisfied. Therefore, the cells on both sides having same source electrode are simultaneously programmed or not programmed so as to have same information. That is, it can be known that the flag cells 41 on the same select gate line have been programmed and used. On the other hand, when checking whether the cells are normally programmed after programming the cells for a constant time under the above describe bias condition, if the program input signal PGM is made low and the readout input signal READ is made High, then the repair cell block reads the information of cell, latches it, and compares it with the already applied address to be repaired so as to check the matching. Therefore, the used only reads the information of the repaired signal REPAIRED, and if the repaired signal is low, it indicates the completion of the program, and if the repaired signal is high, it indicates the incompletion of the program. When the program is not completed, the program is performed by making the program input signal PGM high and the readout input signal READ low. At this time, if the program is normally performed, the program is continuously proceeded by assigning the cell of the address to be repaired and the cell of the flag address, and if there is no address to be repaired, the repair is ended. The repaired address stored in the fuse block 4 with the above described operation is used according to power-on.

Figure 2:
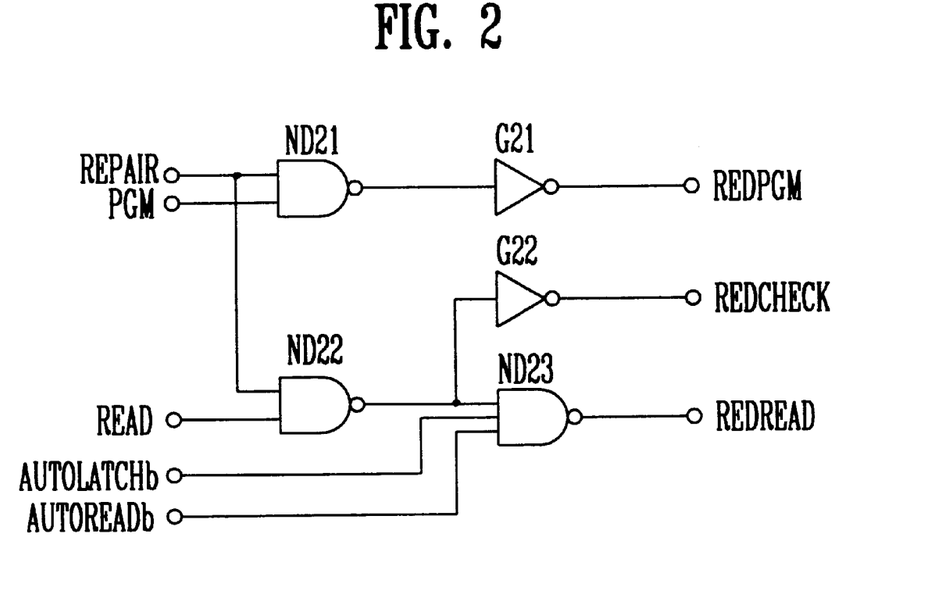
FIG. 2 is a detailed circuit diagram of a repair control circuit of FIG. 1.

FIG. 2 is a detailed circuit diagram of the repair control circuit of FIG. 1. The repair control circuit makes the repair circuit of the present invention to generate the operational signal for each mode. That is, the repair input signal REPAIR and program input signal PGM are input to a NAND gate ND21 and output the program signal REDPGM for programming the redundancy cell through an inverter G21. In addition, the repair input signal REPAIR and redout signal READ are input to a NAND gate ND22 and output the program check signal REDCHECK of the redundancy cell through an inverter G22. On the other hand, the latch and readout signals AUTOLATCHb and AUTOREADb output from the address generating circuit 1 and the output signal of the NAND gate ND22 are input to a 3-input NAND gate ND23 and output the readout signal REDREAD of the redundancy cell.

Figure 3:
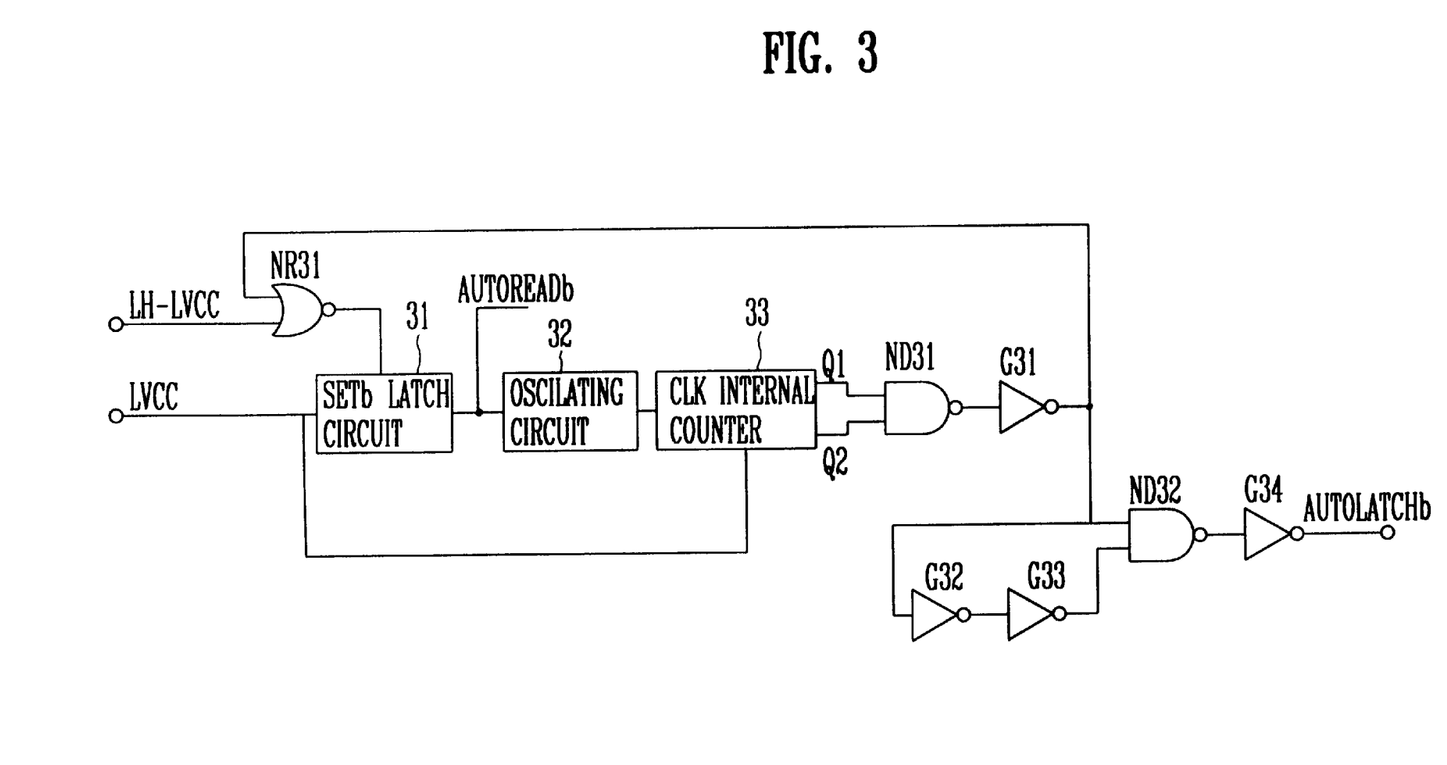
FIG. 3 is a detailed circuit diagram of an address generating circuit of FIG. 1.

FIG. 3 is a detailed circuit of the address generating circuit of FIG. 1. The operation of the address generating circuit is described below.

The circuit automatically generates the address for selecting the select gate line of the fuse block according to the power-on. If an input of a latch circuit 31 becomes low, the latch circuit 31 latches the input and does not receive the input until a control signal SETb is input. When the signal LVCC which varies when the power drops below a certain level is high (power supply below a reference level), an internal counter 33 is reset. When the signal LVCC which varies when the power drops below a certain level is low condition (Normal power supply: LVCC=Low), the input signal LH-LVCC has a pulse, and the latch circuit 31 is set to High by the input signal LH-LVCC. Then, the latch circuit 31 latches the input signal LVCC as low so that the output becomes low state. The low output of the latch circuit 31 operates the oscillating circuit 32. Therefore, a pulse is periodically generated from the oscillating circuit 32 to operate the internal counter 33. On the other hand, the readout signal REDREAD becomes high state b the output signal AUTOREADb of the latch circuit 31 so as to be enabled as a readout mode. The internal counter 33 is operated by the output pulse of the oscillating circuit 32 so as to sequentially generate flag addresses Q1, Q2, and if the last address is generated, the latch circuit 31 detects the address and outputs high so that the oscillation of the oscillating circuit is stopped. At this time, since the output signal AUTOLATCHb becomes high, the readout signal REDREAD is disabled. The readout signal REDREAD maintains the readout signal REDREAD in high state by utilizing the output signal AUTOLATCHb until the readout and latch operation of last address is completed by utilizing a plurality of logic circuit G32, G33, G34, ND32.

Figure 4:
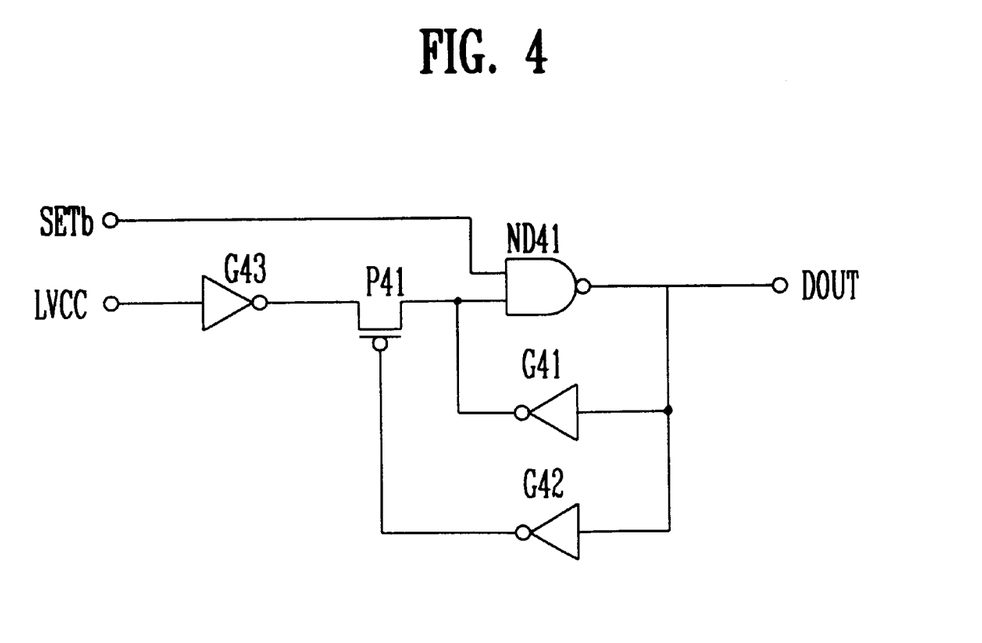
FIG. 4 is a detailed circuit diagram of a latch circuit of FIG. 3.

FIG. 4 is a detailed circuit diagram of the latch circuit of FIG. 3 the output signal becomes high by a NAND gate ND41 which takes as an input a pulse of set signal SETb. Therefore, the PMOS transistor P41 is turned on which takes as an input the output signal through the inverted gate G42. At this time, the input signal LVCC is input to other input terminal of the NAND gate ND41 through an inverted gate G43 and PMOS transistor P41. The output signal through the inverted gate G42 is simultaneously input to the input terminal of the NAND gate ND41. At this time, since the input signal LVCC is in Low state, the output of the NAND gate ND41 becomes low state so that the PMOS transistor P41 is turned off. Therefore, the input is no longer received and the output is latched in low state.

Figure 5:
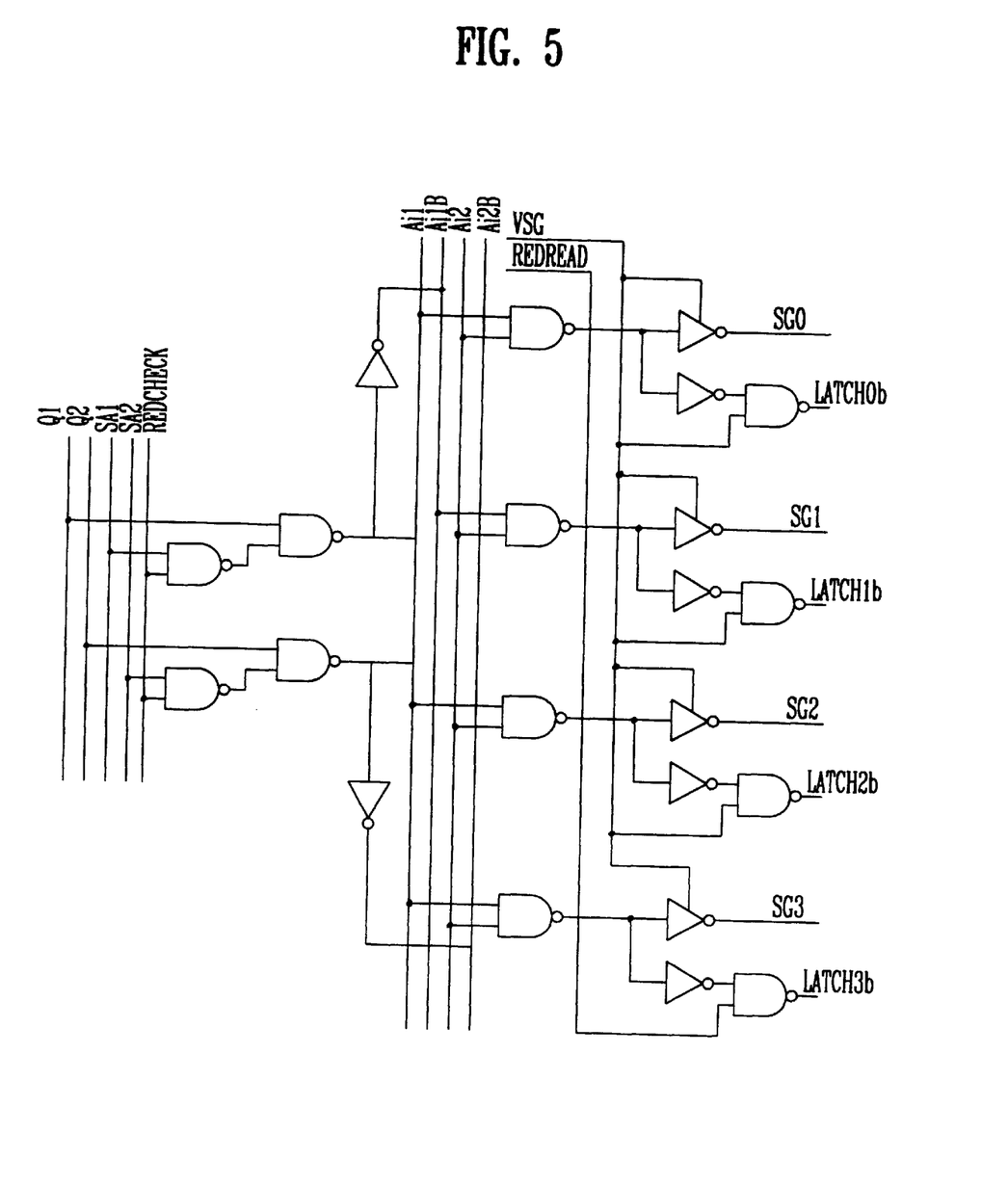
FIG. 5 is a detailed circuit diagram of a first decoder circuit of FIG. 1.

FIG. 5 is a detailed circuit diagram of the first decoder circuit of FIG. 1. The select gate line of the fuse block is selected by flag address Q1, Q2 generated by the address generating circuit and the flag address SA applied externally. The external address is used at the time of repair clock mode (REDCHECK="H") and the flag address generated at the address generating circuit is used at other time. A signal for opening a path to latch an information read at the cells of the selected select gate line is controlled by the readout signal REDREAD.

Figure 6:
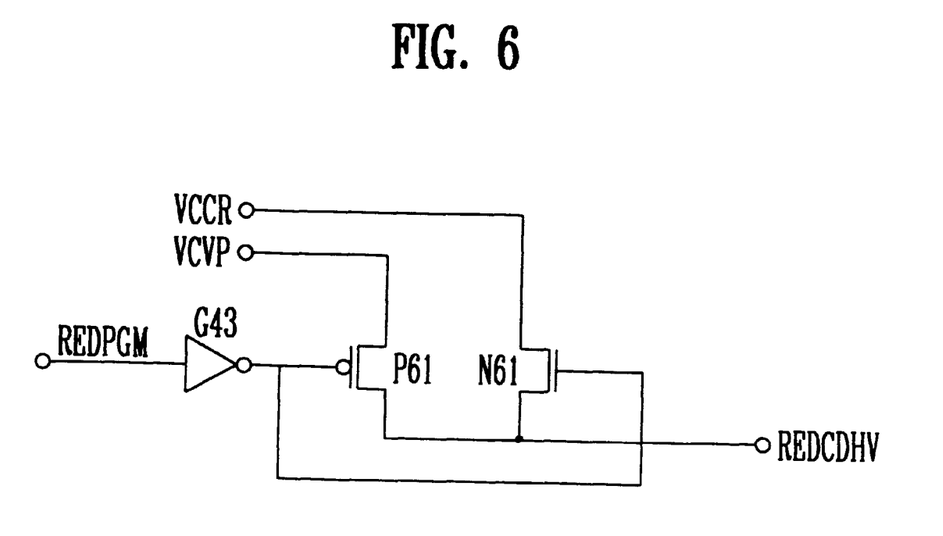
FIG. 6 is a detailed circuit diagram of a voltage supply circuit of FIG. 1.

FIG. 6 is a detailed circuit diagram of the voltage supply circuit of FIG. 1. A voltage is selected to be applied to a control gate of cells in the fuse block. A PMOS transistor P61 is turned on at the time of programming the repair address, and the program voltage VCVP is output to an output REDCGHV. At time, NMOS transistor N61 is turned on so that the readout voltage VCCR is output to the output REDCGHV.

Figure 7A:
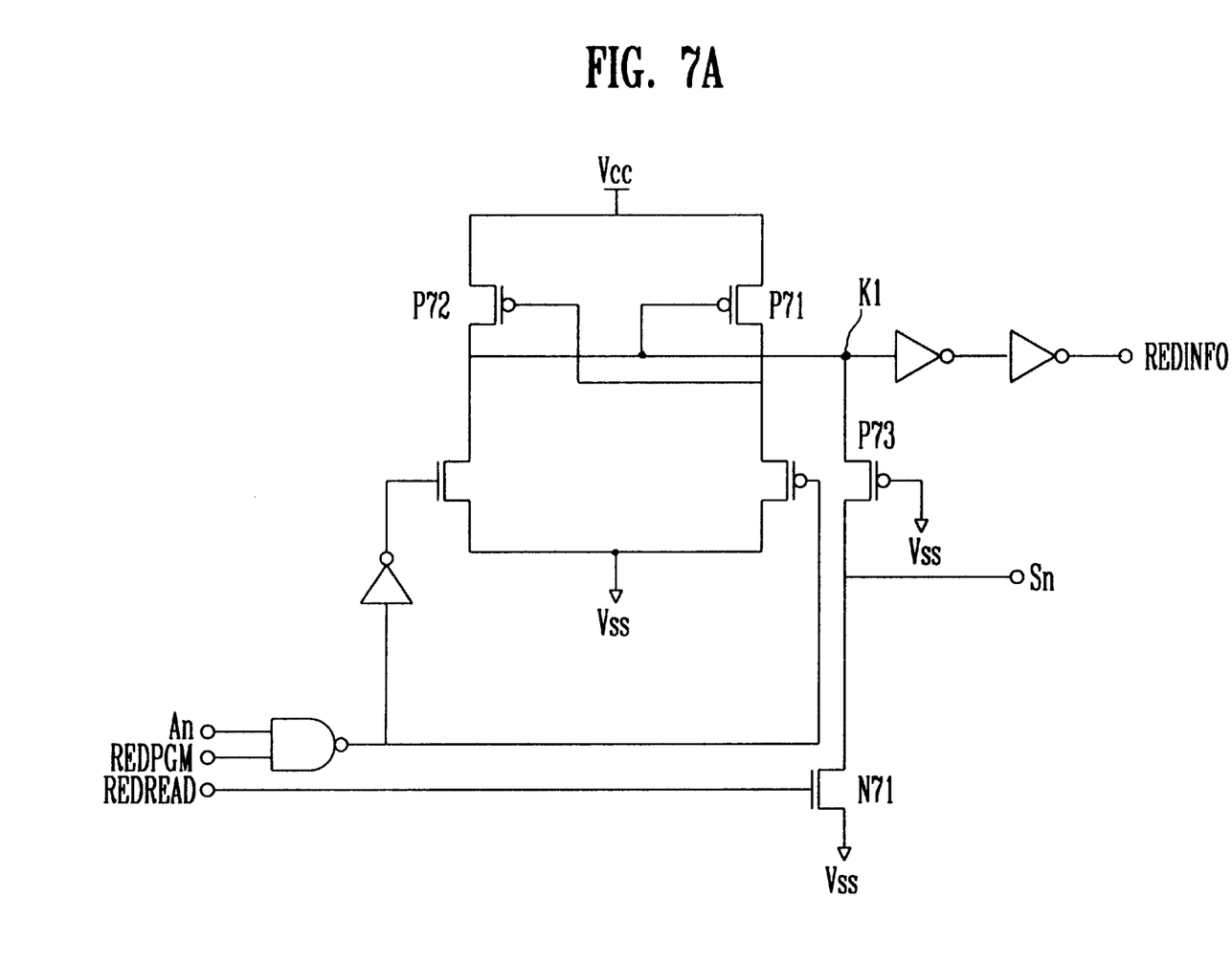
FIGS. 7A and 7B are detailed circuit diagram of a sense amplifier circuit of FIG. 1.
Figure 7B:
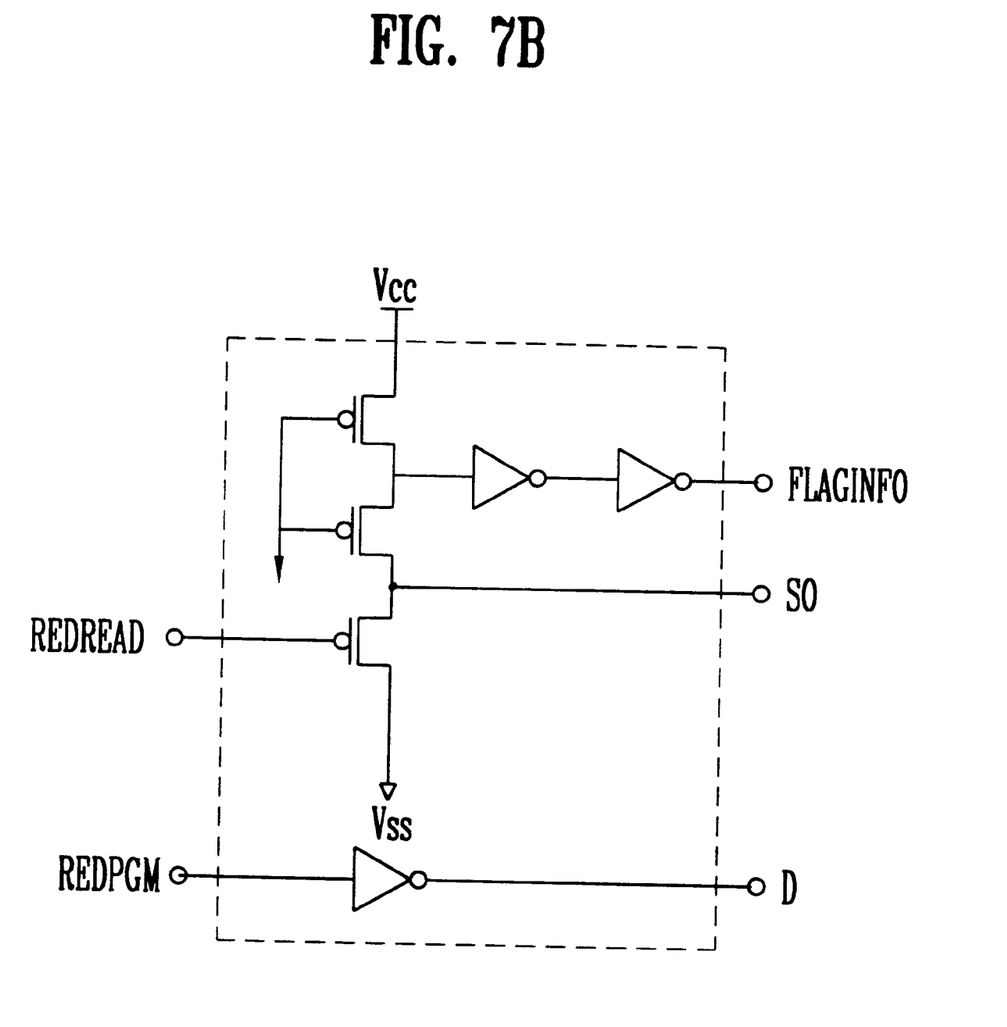

FIGS. 7A and 7B are detailed circuit diagrams of the sense amplifier circuit of FIG. 1. FIG. 7A shows a sense amplifier circut for sensing the cells in the fuse block into which the address will be stored. When storing the address (REDPGM="H"), the voltage of output Sn is determined by an address input An. In the repair readout mode, the current passes through a PMOS transistor P71 a PMOS transistor P73 and a NMOS transistor N71, which takes as an input the readout signal REDREAD, to the ground. At this time, the data in the cells connected to the output Sn are sensed and the results are output to an output REDINFO. If the cells connected to the output Sn are programmed cells, the output REDINFO becomes high, and if the cells are erased cells, the cell current flows out through the output Sn so that the potential at a node K1 becomes low state and the output REDINFO becomes low state. When the sense amplifier is disabled (REDPGM="L"), the output Sn is maintained at a level same as ground potential Vss.

FIG. 7B shows a sense amplifier circuit for sensing the flag cells. The flag cells are sensed by the readout signal REDREAD and the sensing operation is the same as the operation shown in FIG. 7A.

Figure 8:
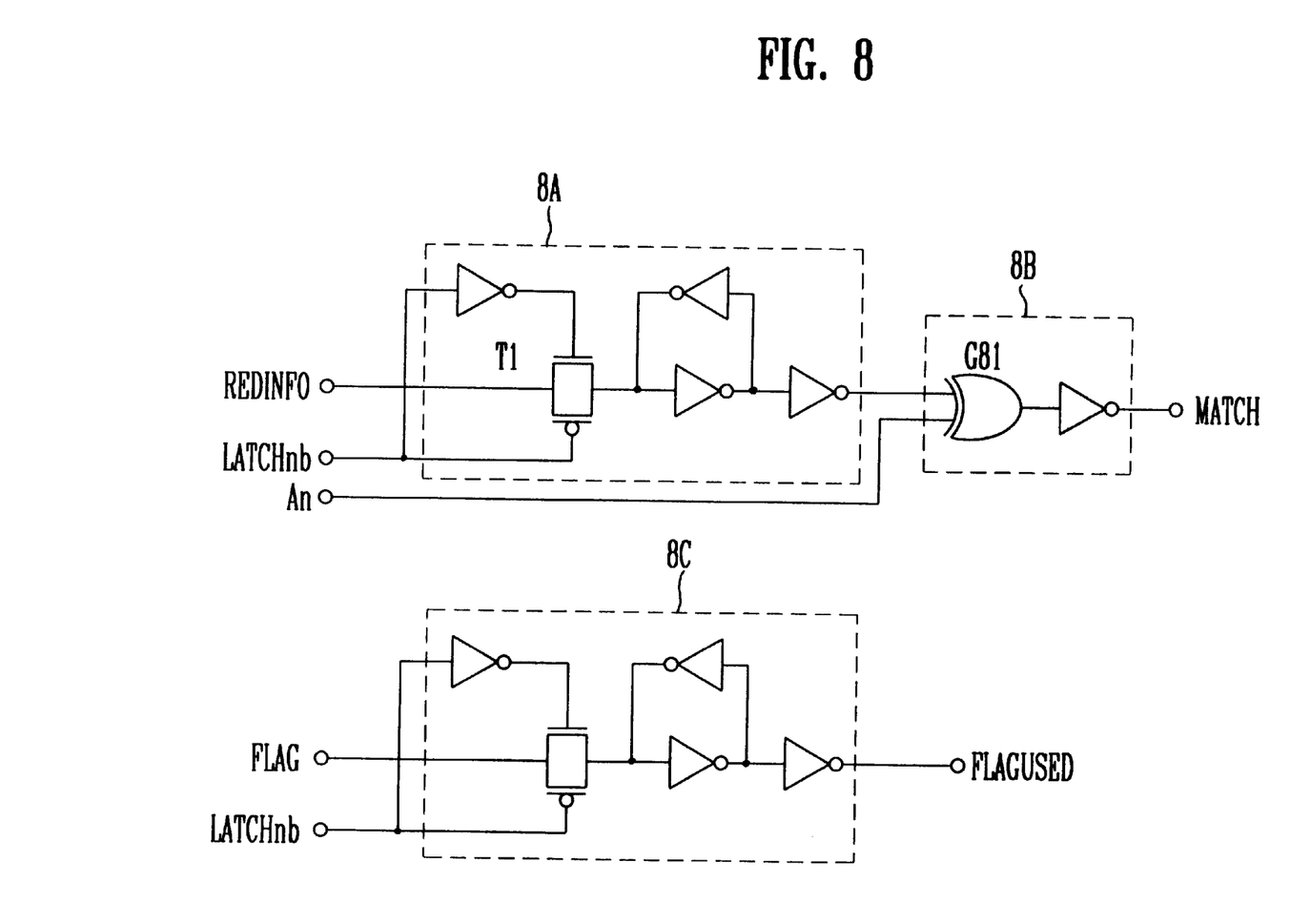
FIG. 8 is a detailed circuit diagram of a data latch and address comparing circuit of FIG. 1.

FIG. 8 is a detailed circuit diagram of the data a latch and address comparison circuit. The circuit is composed of a latch circuit 8A for latching the date sensed from the sense amplifier, and an address comparison circuit 8B for deciding the matching by comparing the latched data and the input address An. The latched data are stored, when the sense amplifier is disabled, by utilizing as an input the output REDINFO of the sense amplifier and an input signal LATCHnb for controlling the latch circuit 8A. That is, when the input signal LATCHnb is low, the output REDINFO of the sense amplifier is latched through a transfer gate T1. Thereafter, the latched signal and the input address An are input to the comparison circuit 8B so that the output MATCH is determined. A latch circuit 8C is identical to the latch circuit 8A, wherein the latch circuit 8C is used for a flag cell.

Figure 9:
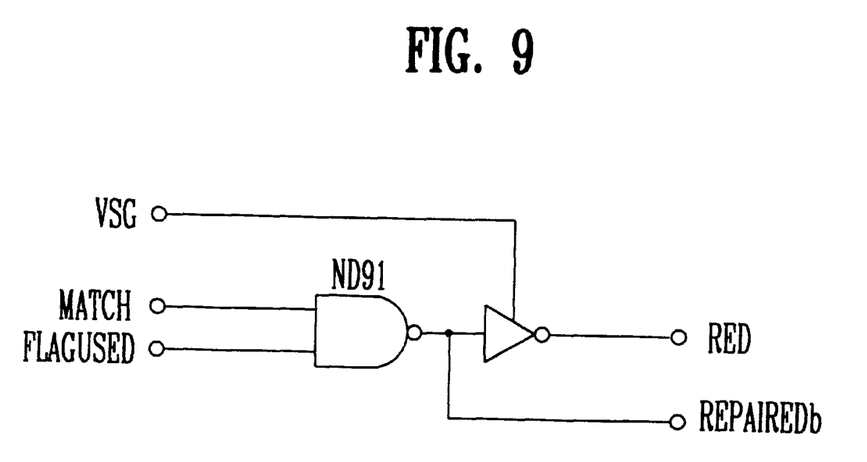
FIG. 9 is a detailed circuit diagram of a second decoder circuit of FIG. 1.

FIG. 9 is a detailed circuit of the second decoder circuit of FIG. 1. When both of the input signals MATCH, LATCHnb are high, the output signal RED for selecting the redundancy cell (not shown) is generated.

Figure 10A:
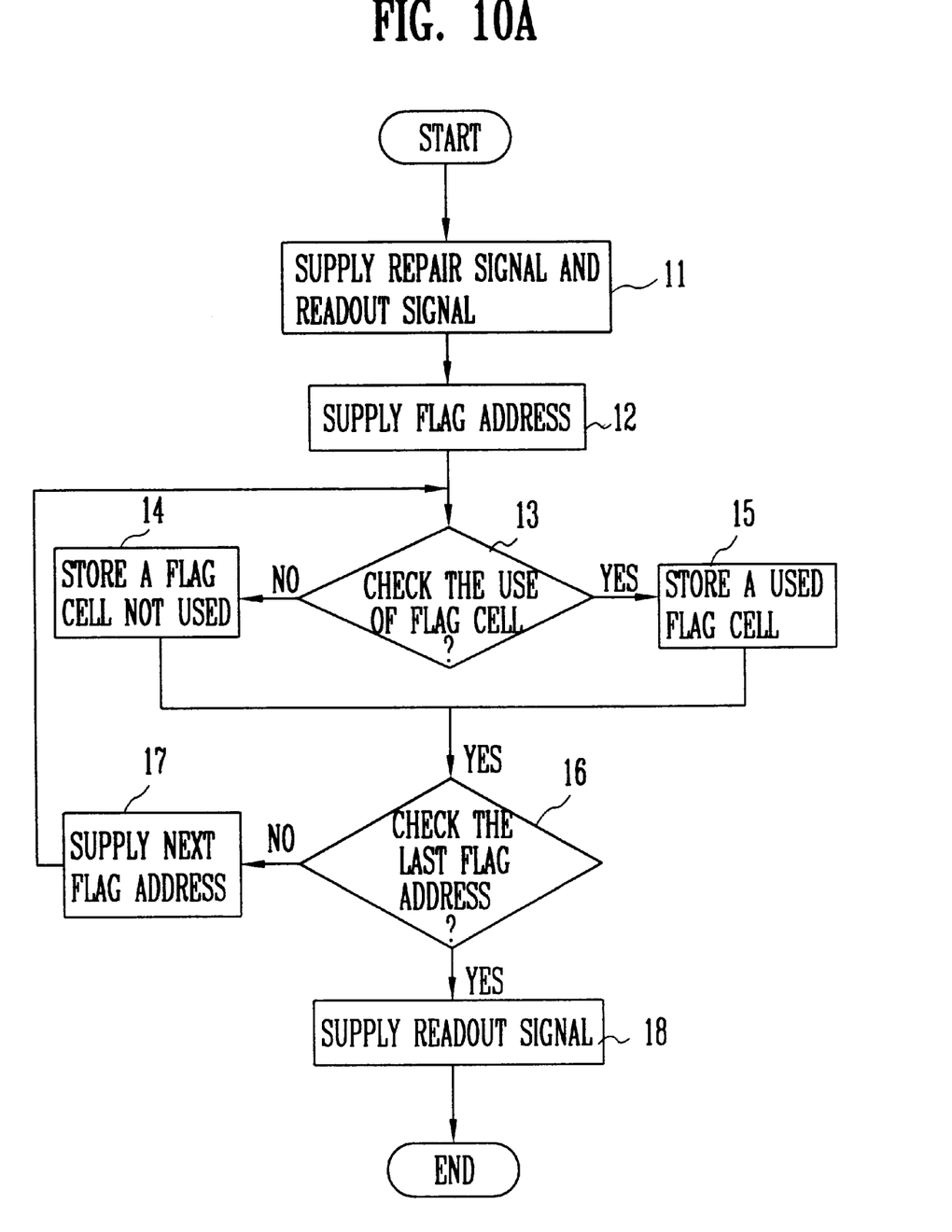
FIGS. 10A and 10B are flow charts to illustrate a repair method according to the present invention.
Figure 10B:
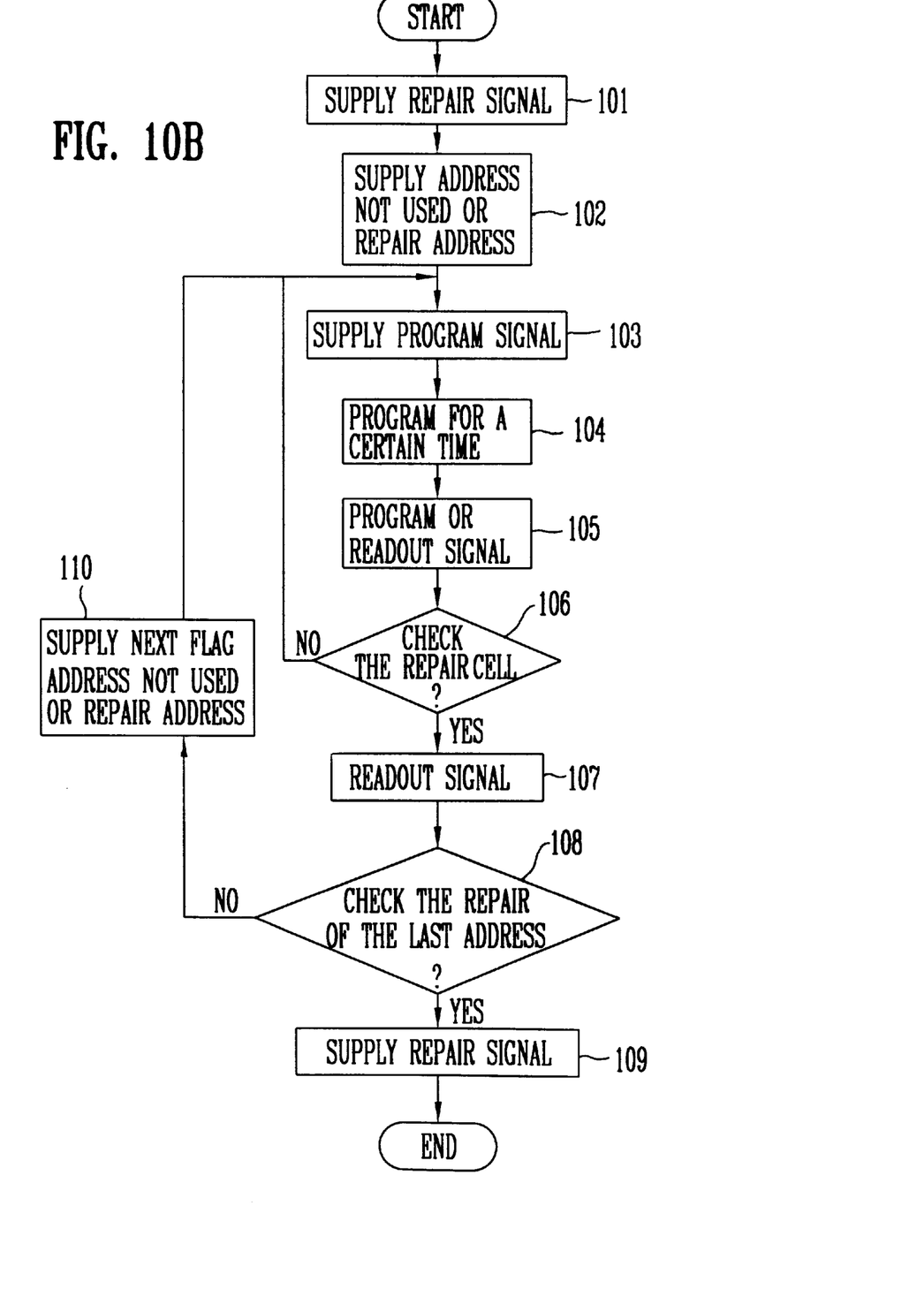

FIGS. 10A and 10B are flow charts to illustrate the repair method according to the resent invention. The operation of the method for checking the use of the flag cell is described below with reference to FIG. 10A.

At step 11 from the start signal, the repair signal and readout signal are applied as high so that the repair check mode is enabled, then proceeding to step 12. At step 12, the flag address to be checked is applied, then proceeding to step 13. At step 13, the output signal USEDb of whether the flag cell is used or not checked. At the step 13, if the output signal USEDb of the use of flag cell is low, the flow proceeds to step 15 where the used flag cell is stored, and if the output signal USEDb of the use of flag cell is high, the flow proceeds to step 14 where the flag cell not used is stored. Then, the flow proceeds from the step 14, 15 to the step 16 to check the last flag address. At the step 16, if it is not the last flag address, the flow proceeds to step 17. At the step 17, the next flag address is applied and the flow proceed to the step 13 to repeat the above described operation. If it is the last flag address at the step 16, the flow proceeds to step 18 where the readout signal is applied as low to terminate the repair address to the flag cell not used. The operation is described below.

At step 101 from the start signal, the repair signal is applied as high so that the repair mode is enabled, then proceeding to step 102. At the step 102, the flag address of the flag not used or the repair address is applied, then proceeding to step 103. At step 103, the program signal is applied to high, then the flow proceeds to step 104 where the program is proceeded for a certain time, then proceeding to step 105. At the step 105, the program signal is applied to low and the readout signal is high, then the flow proceeds to step 106 where it is confirmed whether the flag cell is repaired. At the step 106, if the repair check output signal of the flag cell is low, the flow proceeds to step 103 to repeat the above described operation. If the repair check output signal of the flag cell is high at the step 106, the flow proceeds to step 107 where the readout signal is applied to low, then proceeding to step 108. At the step 108, the repair of the last address is checked. If the last address is not repaired at the step 108, the flow proceeds to step 110. At the step 110, the next flag address not used or the repair address is applied, then the flow proceeds to the step 103 to repeat the above described operation. If the last address is checked as repair at the step 108, the flow proceeds to step 109 where the repair signal is applied to low to terminate the repair operation.

As described above, the present invention has excellent effects in that it can reduce the power consumption by detecting the power supply applied to the chip, latching the repaired address stored in the fuse block after the chip itself sequentially reads the fuse block, comparing the latched address with the input repair address to access the main cell and repair cell, consuming the power only while the chip reads the fuse block, and using the latched repair address at other operation, and it can reduce the area of the chip by constructing into a cell array the cells to which the repair address is to be stored and using the sense amp commonly. In addition, the electrical repair is possible so that the repair is possible and the yield can be increased not only before packaging but also after packaging, and the repair is also possible on a system.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A repair circuit of a flash memory cell comprising:
   an address generating circuit for generating an address by detecting an input supply voltage;
   a repair control circuit for generating a program, program check and readout operation performance signal of a redundancy cell according to an output signal of said address generating circuit and a plurality of input signals;
   a first decoder circuit taking as inputs the address of said address generating circuit, the program check signal of said redundancy cell which is an output signal of said repair control circuit, and a flag address;
   a fuse block of which a select gate line is selected according to the output signal of said first decoder circuit;
   a voltage generating circuit, which takes as an input the program signal of said redundancy cell which is an output signal of said repair control circuit, and which selectively supplies a voltage to a control gate of the cell in said fuse block;
   a sense amplifier circuit, which takes as inputs the program signal, readout signal and repair address of said redundancy cell which are output signals of said repair control circuit, and which senses the cell data in said fuse block;
   a data latch and address comparison circuit, which takes as inputs the output signal and the repair address of said first decoder circuit, latches the data sensed as the sense amplifier circuit, and checks the matching by comparing the latched data with said input repair address; and
   a second decoder circuit which selects a repair line according to an address output from said data latch and address comparison circuit and generates a control signal to prevent the pass of a main cell.

2. The repair circuit of claim 1, wherein said repair control circuit comprises:
   a first NAND gate which takes as inputs a repair input signal and program input signal and outputs the program signal for programming said redundancy cell through an inverter;
   a second NAND gate which takes as inputs the repair input signal and readout signal and outputs the program check signal of said redundancy cell through an inverter; and
   a 3-input NAND gate which takes an inputs a latch signal and a readout signal output from said address generating circuit, and an output signal of said 3-input NAND gate, wherein said 3-input NAND gate outputs a readout signal to read a data stored in said redundancy cell.

3. The repair circuit of claim 1, wherein said address generating circuit is constructed to generate an address for automatically selecting the select gate line of said fuse block according to power-on.

4. The repair circuit of claim 1, wherein said address generating circuit comprises:
   a latch circuit, which takes as an input a signal which is a signal varying when the power drops below a certain level, and which latches the input when the input becomes low and does not receive an input before next control signal is input;
   an oscillating circuit which takes as an input the output signal of said latch circuit; and
   an internal circuit which takes as an input the output signal of said oscillating circuit and which is reset according to a signal varying when a power drops below a certain level;
   wherein said address generating circuit is constructed to generate an address until the readout and latch operation of the last flag address is completed by utilizing a plurality of logic circuit, the flag address being sequentially generated when said internal counter is operated.

5. The repair circuit of claim 1, wherein said latch circuit comprises a NAND gate which takes as an input a set signal, and wherein said latch circuit is constructed in such a way that the signal which is a signal varying when the power drops below a certain level is input to the other input terminal of said NAND gate and latched according to the operation of PMOS transistor taking as an input the output signal of said NAND gate.

6. The repair circuit of claim 1, wherein said first decoder circuit is constructed to select said select gate line of said fuse block according to the flag address generated at said address generating circuit and the flag address applied externally.

7. The repair circuit of claim 1, wherein said voltage generating circuit is constructed to selectively supply the program voltage and readout voltage to the control gate of the cells in said fuse block according to the operation of PMOS transistor which takes as an input the program input signal and NMOS transistor.

8. The repair circuit of claim 1, wherein said data latch and address comparison circuit comprises:
   a latch circuit for latching a data sensed from said sense amplifier; and
   an address comparison circuit for determining the matching by comparing said latched data and input address.

* * * * *